US012648103B2

(12) United States Patent
Chung

(10) Patent No.: US 12,648,103 B2
(45) Date of Patent: Jun. 2, 2026

(54) PRINTED CIRCUIT BOARD CARD RETENTION

(71) Applicant: Hewlett-Packard Development Company, L.P., Spring, TX (US)

(72) Inventor: Tien Liang Chung, Taipei City (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 224 days.

(21) Appl. No.: 18/550,017

(22) PCT Filed: Mar. 12, 2021

(86) PCT No.: PCT/US2021/022074
§ 371 (c)(1),
(2) Date: Sep. 11, 2023

(87) PCT Pub. No.: WO2022/191850
PCT Pub. Date: Sep. 15, 2022

(65) Prior Publication Data
US 2024/0155797 A1     May 9, 2024

(51) Int. Cl.
*H05K 7/14* (2006.01)

(52) U.S. Cl.
CPC ................................. *H05K 7/1417* (2013.01)

(58) Field of Classification Search
CPC .. H05K 7/1402; H05K 7/1417; H05K 7/1076; H05K 7/103; G06F 1/183; G06F 1/184; G06F 1/185
See application file for complete search history.

(56) References Cited

U.S. PATENT DOCUMENTS

| | | | | |
|---|---|---|---|---|
| 5,260,854 A | * | 11/1993 | Hileman | H05K 7/142 |
| | | | | 439/74 |
| 5,694,291 A | | 12/1997 | Feightner | |
| 7,161,798 B2 | | 1/2007 | Chen et al. | |
| 7,252,528 B1 | * | 8/2007 | Tsao | G06F 1/185 |
| | | | | 361/759 |
| 9,022,809 B2 | | 5/2015 | Tang et al. | |
| 10,076,047 B1 | * | 9/2018 | Chang | G06F 1/183 |
| 10,622,026 B1 | * | 4/2020 | Tsorng | H05K 5/0204 |
| 2009/0049214 A1 | * | 2/2009 | Chen | G06F 11/2221 |
| | | | | 710/104 |
| 2016/0261083 A1 | * | 9/2016 | Chu | H05K 7/1489 |
| 2021/0132667 A1 | * | 5/2021 | Wong | G06F 1/183 |

* cited by examiner

Primary Examiner — Sagar Shrestha
Assistant Examiner — Peter Krim
(74) Attorney, Agent, or Firm — Quarles & Brady LLP

(57) ABSTRACT

In some examples, a printed circuit board (PCB) card retention system can include a bracket, a fixed protrusion at a first location on the bracket, where the fixed protrusion includes a face, and a movable mechanism coupled to the bracket at a second location a distance away from the first location, where the movable mechanism includes a face, a positioning mechanism to position the face of the movable mechanism at a position of a plurality of positions that are each a different distance away from the face of the fixed protrusion, and a translation mechanism to permit the face of the movable mechanism, when at the position, to translate.

17 Claims, 4 Drawing Sheets

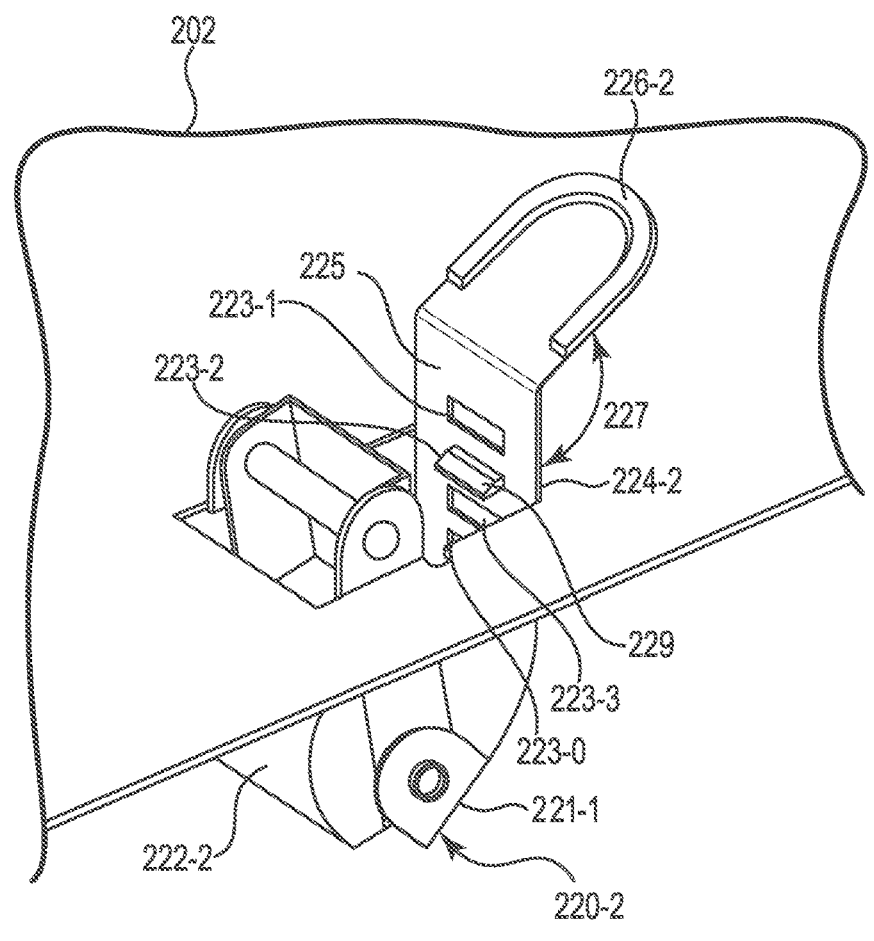
Fig. 2
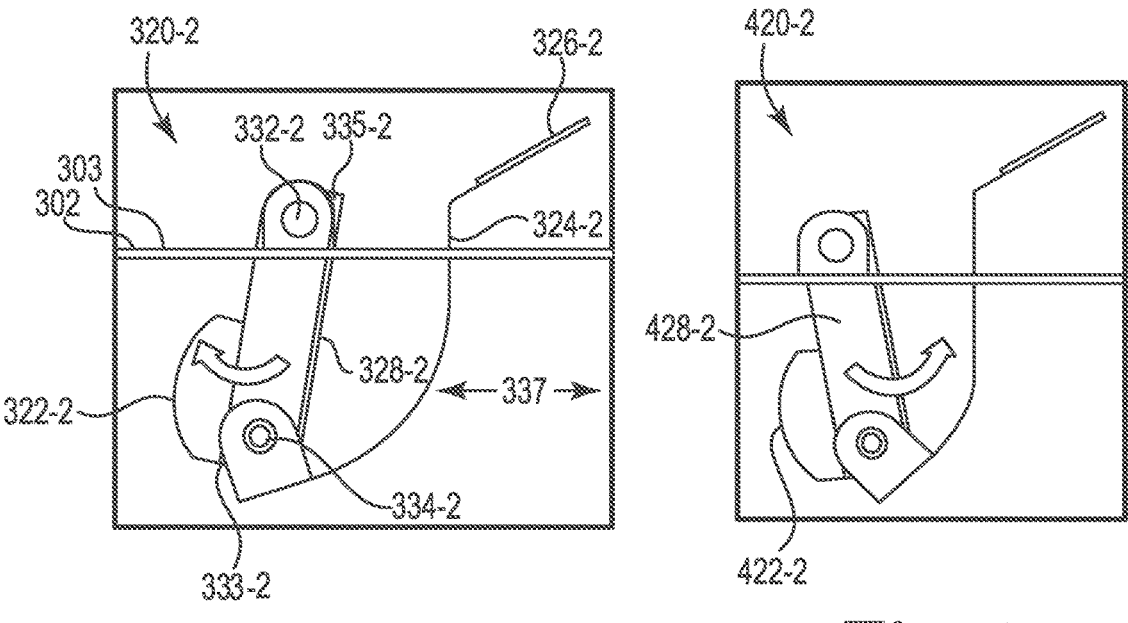
Fig. 3 Fig. 4

PRINTED CIRCUIT BOARD CARD RETENTION

BACKGROUND

Electronic devices such as laptops, desktops, etc. can include various electrical components such as a printed circuit board (PCB) card. Examples of PCB cards include graphics cards, wireless networking cards, among other types of PCB cards. An electronic device can be transported from a given location to another location. For instance, an electronic device can be transported from a point of manufacture and/or a supplier to a retailer and/or an end user of the electronic device.

BRIEF DESCRIPTION OF THE DRAWINGS

FIG. 2 illustrates a view of a portion of a PCB card retention system consistent with the disclosure.

FIG. 3 illustrates a view of a portion of a PCB card retention system in a first position consistent with the disclosure.

FIG. 4 illustrates a view of portion of a PCB card retention system in a second position consistent with the disclosure.

DETAILED DESCRIPTION

Figure 1:
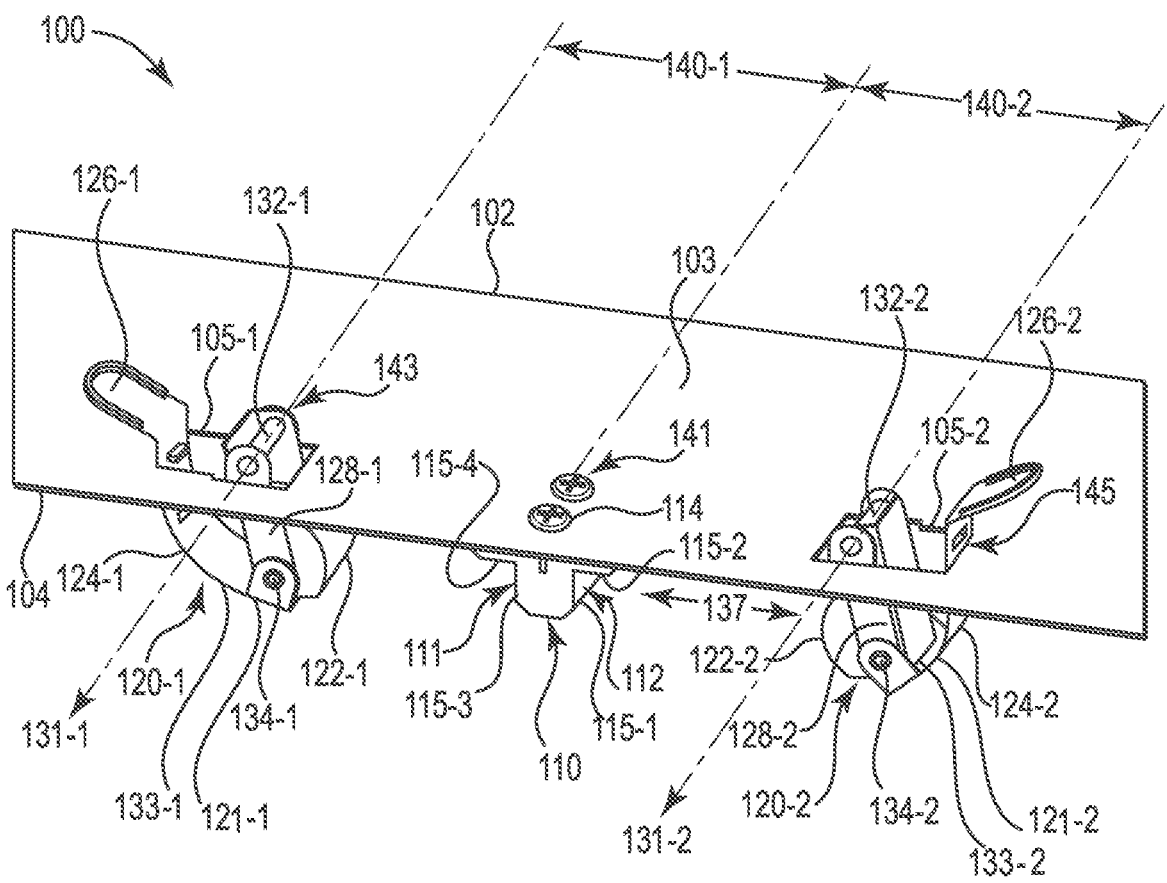
FIG. 1 illustrates an example of a printed circuit board (PCB) card retention system consistent with the disclosure.

As mentioned, an electronic device can be transported from a point of manufacture and/or a supplier to a retailer and/or an end user of the electronic device. However, during transport an electronic device can encounter shock and/or vibrations. As a result, an electronic device can become damaged and/or components of the electronic device may become decoupled/electrically disconnected from each other.

For example, a PCB card can be coupled to a socket of an electronic device to provide an electrical connection between the PCB card and another component (e.g., a motherboard, PCB, etc.) of the electronic device. However, shock and/or vibrations during transport can exert enough force on the PCB card and/or the socket to cause the PCB card to dislodge from the socket, thus eliminating or creating a partial loss of electrical contact between the PCB card and the socket. As a result, the electronic device including the dislodged PCB card can fail to operate as intended and/or the PCB card may have to be 're-seated' in the socket for the electronic device to operate as intended.

As such, some approaches may attempt to constrain movement of a PCB card and/or otherwise maintain a PCB card in a socket of an electronic device. For instance, some approaches may employ a bracket or other type of retention mechanism that is shaped/sized to a particular shape/size of an individual factory-installed PCB card in an attempt to constrain movement of a PCB card.

However, end users of an electronic device may seek to replace a PCB card with a different PCB card. For instance, an end user of an electronic device may seek to replace a factory-installed graphics card with an updated graphics card. Yet, different types of PCB cards can be shaped/sized differently. Therefore, a replacement PCB card may not fit into an existing bracket or other type of retention mechanism with a predetermined shape/size. Moreover, even a replacement PCB card that is the same type as the factory installed PCB card can nevertheless vary in shape/size (e.g., due to variations in manufacturing processes/design tolerances). Further, in some instances an end-user may seek an option to selectively use different PCB cards and therefore seek to retain multiple PCB cards (e.g., two graphics cards) in the same electronic device. Approaches such as those which employ a bracket or other type of retention mechanism with a predetermined shape/size to retain an individual factory installed PCB card do not permit an electronic device to retain multiple PCB cards, let alone, to retain multiple PCB cards having different shapes/sizes.

Accordingly, the disclosure is directed to PCB card retention systems and electronic devices including PCB card retention systems, as detailed herein. For example, a PCB card retention system can include a bracket, a fixed protrusion, and a movable mechanism. The fixed protrusion can be at a first location on the bracket. The fixed protrusion can include a face to contact a corresponding face of a PCB card, when present. The movable mechanism can be coupled to the bracket at a second location a distance away from the first location. The movable mechanism can include a face, a positioning mechanism, and a translation mechanism. The positioning mechanism can position the face of the movable mechanism at any one of a plurality of positions that are each a different distance away from the face of the fixed protrusion. The translation mechanism can permit the face of the movable mechanism to translate, when at a position of the plurality of positions, relative to a face of a fixed protrusion. For instance, the translation mechanism can permit the face of the movable mechanism to translate along a plane extending in a direction orthogonal to the face of the fixed protrusion. Notably, PCB card retention systems herein can accommodate different types of PCB cards (e.g., by employing the positioning mechanism to account for fundamental differences in PCB card shape/size), and yet, can accommodate size variations/manufacturing differences in cards by employing a translation mechanism), as detailed herein. Moreover, PCB card retention systems can accommodate two or more PCB cards in the same electronic device, in contrast to other approaches which may rely on brackets with predetermined sizes and/or predefined notches/grooves/teeth that move in predefined increments.

FIG. 1 illustrates an example of a PCB card retention system 100. As illustrated in FIG. 1, the PCB card retention system 100 can include a bracket 102, a fixed protrusion 110, and a movable mechanism such as a first movable mechanism 120-1 and/or a second movable mechanism 120-2. While illustrated as dual PCB card retention system including two movable mechanisms, a quantity of movable mechanisms can be increased or decreased. For instance, in some examples a PCB card retention system can be an individual PCB card retention system that includes a fixed protrusion and an individual movable mechanism (e.g., the first movable mechanism 120-1) but does not include an additional movable mechanism (e.g., the second movable mechanism 120-2).

The bracket 102 can be formed of a various materials such as metal, plastic, and/or a combination thereof, among other types of possible materials. The bracket 102 can include faces such as a first face 103 (e.g., a top face) and a second face 104 (e.g., a bottom face). As illustrated in FIG. 1, the first face 103 can be located on a opposite side of the bracket 102 from the second face 104.

The bracket 102 can be sized/shaped to fit into a housing of an electronic device. For instance, the bracket 102 can be disposed inside an electronic device to permit contact of a movable mechanism and/or a fixed protrusion with a PCB card disposed in a socket (e.g., an internal socket included inside a housing) of the electronic device. The bracket 102 can be a separate and distinct component that can be coupled to a housing or other component of an electronic device. However, in some instances, the bracket 102 can be an integral portion of an electronic device such as an integral portion of a housing of the electronic device.

The bracket 102 can include openings such a first opening 105-1 and a second opening 105-2. As illustrated in FIG. 1, a quantity of openings (e.g., two openings) can be equal to a quantity of movable mechanisms (e.g., two movable mechanisms), The openings can each be a distance away from the fixed protrusion 110. For instance, the first opening 105-1 and the second opening 105-2 can be an equal distance from the fixed protrusion 110, as illustrated in FIG. 1. Having the openings be an equal distance away from the fixed protrusion 110 can promote aspects herein.

An opening can be sized to permit a portion of a movable mechanism to be disposed in or otherwise extend through the opening. For example, as illustrated in FIG. 1, the first movable mechanism 1204 can be disposed in the first opening 105-1 such that a portion of the first movable mechanism 120-1 extends out of the first opening 105-1 adjacent the first face 103, while another portion of the first movable mechanism 120-1 extends out of the first opening 105-1 adjacent to the second face 104 of the bracket 102. Having a movable mechanism extend out of an opening in such a manner can permit the movable mechanism to readily contact a PCB card, and yet can permit the movable mechanism to be readily positioned at a given position (e.g., via application of a force to a handle of the movable mechanism), as detailed herein.

The fixed protrusion 110 can be coupled to or integral with the bracket 102. For instance, the fixed protrusion 110 can be coupled to the bracket 102 via a fastening mechanism 114, as illustrated in FIG. 1. Examples of fastening mechanisms include screws, bolts, adhesives, etc. However, in some instances the fixed protrusion can be an integral portion (e.g., a molded portion) of the bracket 102.

The fixed protrusion 110 can include a face such as first face 111 and/or a second face 112. The face of the fixed protrusion 110 can contact a corresponding face of a PCB card, when the PCB card is present. For instance, the first face 111 can contact a face of a second PCB card and the second face 112 can contact a face of a first PCB card, as described in FIGS. 5-6.

In some examples, the first face 111, the second face 112, or both can be formed of a notch. The notch can include a planar first face and a planar second face. The planar first face can be orthogonal to the planar second face. For example, the first face 111 can be formed of a notch have a planar first face 115-3 that is orthogonal to a planar second face 115-4. Similarly, the second face 112 can be formed of a notch having a planar first face 115-1 that is orthogonal to a planar second face 115-2, Having the first face 111, the second face 112, or both be formed of a notch can promote retention of a PCB card in a socket, when the PCB card is present.

As mentioned, the PCB card retention system 100 can include a movable mechanism movable mechanism such as a first movable mechanism 102-1 and a second movable mechanism 120-2 can be formed of various components that permit the movable mechanism to move relative to the fixed protrusion 110. For instance, the movable mechanism can include a face, a positioning mechanism, a translation mechanism.

A movable mechanism can be a coupled to the bracket 102 at a location that is a distance away from the fixed protrusion 110 located at a first location 141. For instance, the first movable mechanism 120-1 can be coupled to the bracket 102 at a second location 143 that is a first distance 140-1 away from the fixed protrusion 110 at the first location 141, while the second movable mechanism 120-2 can be coupled to the bracket 102 at a third location 145 that is a second distance 140-2 away from the fixed protrusion 110. In some examples, the first distance 140-1 and the second distance 140-2 can be equal or substantially equal. As used herein, the term "substantially" intends that the characteristic may not be absolute but is close enough so as to achieve the functions of the characteristic. For example. "substantially equal" is not limited to values that are absolutely equal. For instance, a distance that is substantially equal can be within 0.5%, 1%, 2%, and/or 3% of another distance, herein.

A movable mechanism can be coupled via a coupling member to the bracket 102. That is, the movable mechanism can be movably coupled to the bracket 102 to permit rotation, translation, or both, of the movable mechanism relative to the bracket 102. For instance, as illustrated in FIG. 1, the first movable mechanism 120-1 can be coupled via a first coupling mechanism 132-1 to the bracket 102 to permit rotation of the first movable mechanism 120-1 about a first axis 131-1 extending through the first coupling mechanism 132-1. Similarly, the second movable mechanism 120-2 can be coupled via a first coupling mechanism 132-2 to the bracket 102 to permit rotation of the second movable mechanism 120-2 about a second axis 131-2 extending through the first coupling mechanism 132-2. Permitting rotation of the movable mechanism relative to the bracket can promote adjusting a distance between a face of a movable mechanism and a face of the fixed protrusion and/or can otherwise promote aspects of PCB card retention.

Moreover, as detailed in FIGS. 3 and 4, a first distal end 133-1 of the first translation mechanism 128-1 can be movably coupled via a second coupling mechanism 134-1 to the first distal end 121-1 of the first positioning mechanism 124-1. Similarly, a first distal end 133-2 of the second translation mechanism 128-2 can be movably coupled via a second coupling mechanism 134-2 to the first distal end 121-2 of the second positioning mechanism 124-2. Permitting rotation of the translation mechanism relative to the positioning mechanism can also promote adjusting a distance between a face of a movable mechanism and a face of the fixed protrusion and/or can otherwise promote aspects of PCB card retention.

In some examples, a face of the movable mechanism such as the face 122-1 of the first movable mechanism 120-1 and/or the face 122-2 of the second movable mechanism 120-2 can be arcuate. For instance, as illustrated in FIG. 1, each of the face 122-1 of the first movable mechanism 120-1 and the face 122-2 of the second movable mechanism 120-2 can be arcuate. Having the face of the movable mechanism be arcuate can promote application of a particular amount of force to a corresponding face of a PCB card and/or can accommodate various shaped/sized PCB cards. However, a face of a movable mechanism can be a different non-arcuate shape such as being a planar face, among other possible shapes.

A positioning mechanism (e.g., the first positioning mechanism 124-1) of a movable mechanism the first movable mechanism 120-1) can position the face (e.g., the face 122-1) of the movable mechanism at a position of a plurality of positions. Each position of the plurality positions can be a different distance away from a face (e.g., the first face 111) of the fixed protrusion 110. A positioning mechanism can have an opening or tab, while the bracket. 102 can have a corresponding tab or opening that is to interface with a given opening or tab of the positioning mechanism. For instance, the first positioning mechanism 1241 can include a plurality of openings in which a tab of the bracket 102 can be disposed in, as detailed herein. Which opening is adjacent to the tab can be adjusted by application of a force to the positioning mechanism. The positioning mechanism can include a handle, as detailed herein, to permit the positioning mechanism to be readily adjusted to a given position of the plurality of positions.

Each positioning mechanism can be adjusted independent of another positioning mechanism. For instance, the first positioning mechanism 124-1 can be adjusted independent of any adjustment to the second positioning mechanism 124-2.

A translation mechanism such as a first translation mechanism 128-1 and a second translation mechanism 128-2 can permit a face of a movable mechanism to translate relative to a fixed protrusion. For instance, the translation mechanism can permit a face of a movable mechanism to translate along a plane 137 extending in a direction orthogonal to the face of the fixed protrusion. For example, the translation mechanism can permit the face of the movable mechanism to translate responsive to contact of the face of the movable mechanism with the PCB card, when present. In this way, the face of the movable mechanism can translate a distance, when disposed at a given position, toward or way from a fixed protrusion to account for any variations in a shape/size of a PCB card, and yet is dispositioned by the positioning member toward the fixed protrusion to impart a "pinching" force on the PCB card between the face of the movable member and the face of the fixed protrusion.

In some examples, the first face, the second face, the face of the first movable mechanism, and the face of the second movable mechanism can each be parallel. The first face 111, the second face 112, the face 122-1 of the first movable mechanism 120-1, and/or the face 122-2 of the second movable mechanism 120-2 can have a common plane 137 extending therethrough. For instance, as illustrated in FIG. 1, the plane 137 (extrapolating the illustrated arrows in FIG. 1) extends through the first face 111, the second face 112, the face 122-1 of the first movable mechanism 120-1, and the face 122-2 of the second movable mechanism 120-2. The first face 111, the second face 112, the face 122-1 of the first movable mechanism 120-1, and the face 122-2 of the second movable mechanism 120-2 can be orthogonal to the plane 137 that intersects the first face 111, the second face 112, the face 122-1 of the first movable mechanism 120-1, and the face 122-2 of the second movable mechanism 120-2.

The first face 111, the second face 112, the face 122-1 of the first movable mechanism 120-1, and/or the face 122-2 of the second movable mechanism 120-2 can be co-located on a side of the bracket 102. For instance, the first face 111, the second face 112, the face 122-1 of the first movable mechanism 120-1, and the face 122-2 of the second movable mechanism 120-2 can be co-located on a side of the bracket 102 on the second face 104 of the bracket 102 that is opposite the side (e.g., a side on the first face 103) of the bracket 102 on which a handle such as the handle formed by the second distal end 126-1 of the first positioning mechanism 124-1 and; or by the second distal end 126-2 of the second positioning mechanism 124-2.

The translation mechanism can be coupled to the face of the movable mechanism, the positioning mechanism of the movable mechanism, and the bracket, as detailed herein, with respect to FIGS. 2-6. For instance, the first translation mechanism 128-1 can permit the face 122-1 of the first movable mechanism 120-1, when at a position of the plurality of positions, to translate along the plane 137 extending in a direction orthogonal to the first face 111 of the fixed protrusion 110, as detailed herein. Similarly, the second translation mechanism 128-2 can permit the face 122-2 of the second movable mechanism 120-2, when at a position of the plurality of positions, to translate along the plane 137 extending in a direction orthogonal to the second face 112 of the fixed protrusion 110. The translation mechanism can be located between a face and a positioning mechanism of a movable mechanism. For instance, the face can be located on a side of the movable mechanism, while the positioning mechanism is located on the opposite side of the movable mechanism, as illustrated in FIG. 1.

A face of the fixed protrusion 110, a face of the movable mechanism, or both can be formed of a resilient material. Examples of resilient material include foam, rubber, silicon rubber, or combinations thereof. For instance, the first face 111, the second face 112, or both can be formed of a resilient material. Similarly, the face 122-1 of the first movable mechanism 120-1, the face 122-2 of the second movable mechanism 120-2, or both, can be formed of a resilient material. Having a face formed of a resilient material can promote aspects of PCB card retention such accounting for differences in shape/size of PCB cards and/or securely retaining PCB cards.

FIG. 2 illustrates a view of a portion of a PCB card retention system (the PCB card retention system as illustrated in FIG. 1). As illustrated in FIG. 2, the second movable mechanism 220-2 can include the face 222-2, the second positioning mechanism 224-2, and the second translation mechanism 228-2. The second positioning mechanism 224-2 can include a body 225. The body 225 can include openings 223-1, 223-2, 223-3, to 223-0 extending through the body 225. While FIG. 2 illustrates a given quantity of openings, the quantity of openings can be increased or decreased.

As illustrated in FIG. 2, each of the openings 223-1 to 223-0 can be the same shape and size. Having the openings 223-1 to 223-0 be the same size and shape can permit a tab 229 or other projection of the bracket 202 to be disposed in a given opening and thereby maintain the second positioning mechanism 224-2 at a given position that is a given distance away from a fixed protrusion (e.g., fixed protrusion 110 as described in FIG. 1).

The body 225 can have a first distal end 221-2 and a second distal end 226-2. For instance, as illustrated in FIG. 2, the second distal end 226-2 can form a handle that extends at the angle 227 relative to the body 225. For instance, the second distal end 226-2 can extend at an angle 227 that is in a range from 1 degree to 270 degrees relative to the body 225.

FIGS. 3 and 4 illustrate a view of a portion of a PCB card retention system (as illustrated in FIG. 2) in a first position and a second position, respectively. As mentioned, a movable mechanism can be moved between a plurality of positions to accommodate different shapes/sizes of PCB cards. For instance, FIG. 3 illustrates a view of a portion of a PCB card retention system in a first position. When in the first position, the face 322-2 of the second movable mechanism 320-2 can be closer to a fixed protrusion (e.g., the fixed protrusion 110 illustrated in FIG. 1) as compared to when the second movable mechanism 320-2 is in a second position, as illustrated in FIG. 4. When in the first position a tab (e.g., tab 229 as illustrated in FIG. 2) can be in a different opening of the plurality of openings (e.g., openings 223-1, 223-2, 223-3 to 223-0 as illustrated in FIG. 2) than an opening associated with the second position. The second movable mechanism 320-2 can be positioned at the first position to accommodate a thinner/smaller PCB card, among other possibilities.

The second positioning mechanism 324-2 can include a first distal end 321-2, a second distal end 326-2. The second translation mechanism 328-2 can include a first distal end 333-2 and a second distal end 335-2. The first distal end 333-2 of the second translation mechanism 328-2 can be movably coupled via a second coupling mechanism 334-2 to the first distal end 321-2 of the second positioning mechanism 324-2. The second distal end 335-2 of the translation mechanism 338-2 can be movably coupled via a first coupling mechanism 332-2 to the bracket 302 (e.g., to the first face 303 of the bracket 302). As mentioned, the translation mechanism 328-2 can translate along a plane 337 extending in a direction orthogonal to the face of the fixed protrusion the face 115-1 of the fixed protrusion 110 as illustrated in FIG. 1). For instance, the translation mechanism 328-2 can transition between the first position and the second position, among other possible positions, by way of translation along the plane 337.

FIG. 1 illustrates a view of portion of a PCB card retention system in a, second position. As illustrated in FIG. 4, the second translation mechanism 428-2 can be positioned at a second position of a plurality of positions. For instance, when at the second position the face 422-2 of the second movable mechanism 420-2 can be further from the face of the fixed protrusion as compared to when at the first position. For instance, the second movable mechanism 420-2 can be positioned at the second position to accommodate a thicker/larger PCB card, among other possibilities.

Figure 5:
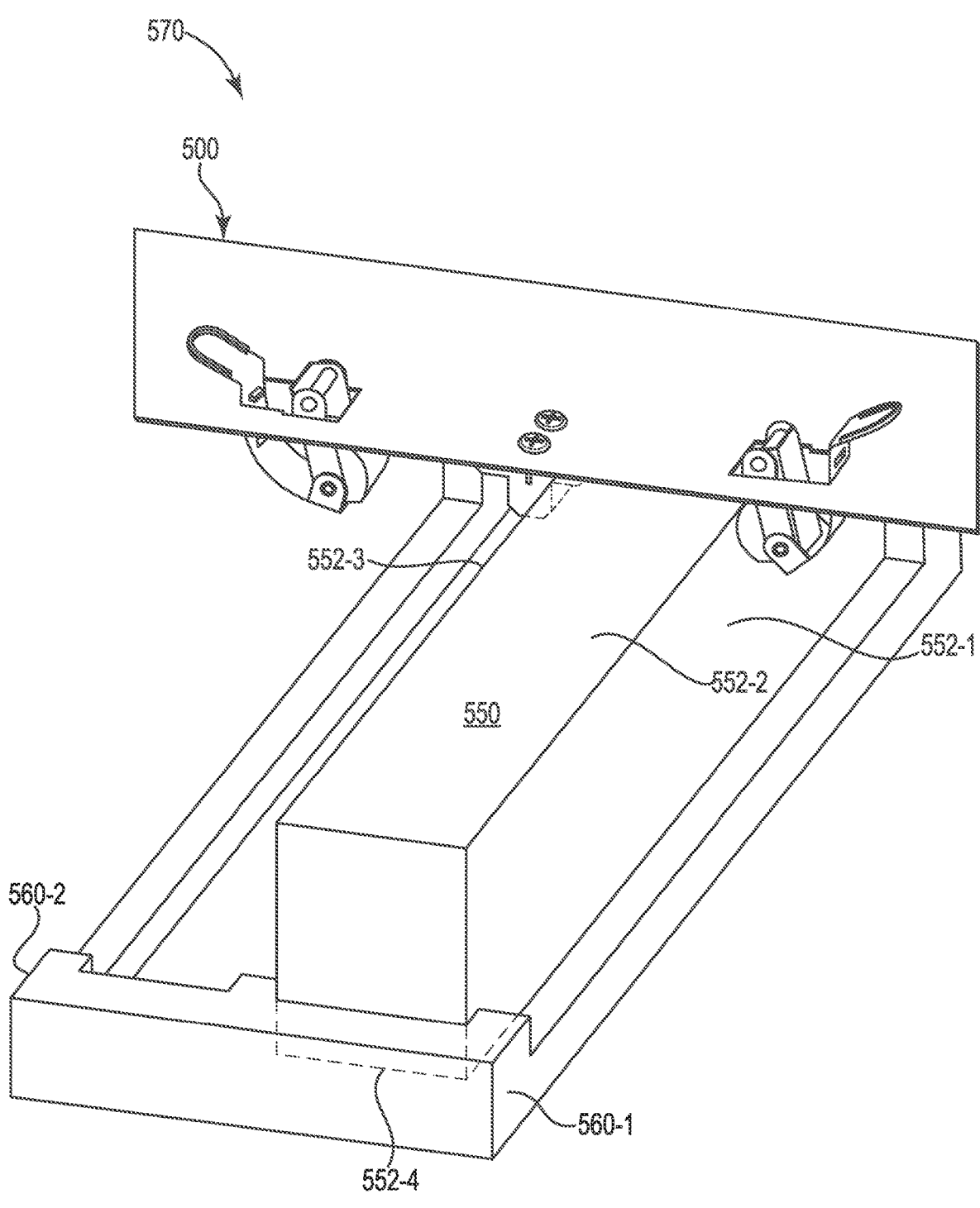
FIG. 5 illustrates an example of a portion of an electronic device consistent with the disclosure.

FIG. 5 illustrates an example of a portion of an electronic device 570. The electronic device 570 can include a PCB card retention system 500. The PCB card retention system 500 can be analogous or similar to the PCB card retention system 100 as described herein with respect to FIG. 1.

As illustrated in FIG. 5, the electronic device 570 can include a socket such as a first socket 560-1 and a second socket 560-2. The socket can be formed as a slot that is to receive a PCB card such as a first PCB card 550. The first PCB card 550 can include a plurality of faces such as a first face 552-1, a second face 552-2, a third face 552-3 and a fourth face 552-4, among other possibilities. Furthermore, the socket can include contacts (not illustrated) to provide electrical connectivity between the first PCB card 550 and the electronic device 570 such as a PCB of the electronic device 570. That is, a contact area of the PCB card (e.g., the fourth face 552-4 and/or an edge connector in or extending from the fourth face 552-4) of the first PCB card 550 can be shaped to correspond to the contact area of the receiving socket such as the first socket 560-1. Thus, when the first PCB card 550 is inserted into the socket such as the first socket 560-1, electrical connection and communication is provided between the first PCB card 550 and the socket and thereby between the first PCB card 550 and a PCB (not illustrated) of the electronic device 570.

In some examples, the first PCB card 550 can be graphics card, among other possibilities. In some examples the first PCB card 550 can be a DIMM, among other possibilities.

Figure 6:
FIG. 6 illustrates another example of a portion of an electronic device consistent with the disclosure.

FIG. 6 illustrates another example of a portion of an electronic device 670. The electronic device 670 can be analogous or similar to the electronic device 570 as described herein with respect to FIG. 5.

A PCB card such as the first PCB card 650 and a second PCB card 651 can be disposed the first socket 660-1 and the second socket 660-2, respectively. That is, the PCB card retention system 600 can retain a plurality of PCB cards in a plurality of sockets in an electronic device.

The first PCB card 650 and the second PCB card 651 can be different shapes/sizes. For instance, as illustrated in FIG. 6, the first PCB card 650 can be larger such as having a larger width 655 than a width 656 of the second PCB card 651. As such, the second movable mechanism 620-2 can be at a different position (e.g., a second position as illustrated in FIG. 4) than a position (e.g., a first position as illustrated in FIG. 3) of the first movable mechanism 620-1 to accommodate the difference in width of the first PCB card 650 and the second PCB card 651. As mentioned, the first PCB card 650, the second PCB card 651, or both, can be a graphics card. For instance, the first PCB card 650 can be a first size of graphics card and the second PCB card 651 can be a second size of graphics card (e.g., having a different width than the first size of graphics card).

The first PCB card 650 can include a body having a plurality of faces including a first face 652-1, a second face 652-2, a third face 652-3, and a fourth face 652-4. As illustrated in FIG. 6, the first face 652-1 can be opposite the third face 652-3 and the second face 652-2 can be opposite the fourth face 652-4. The fourth face 652-4 can be disposed in the first socket 660-1 while the third face 652-3 is in contact the fixed protrusion 610 (e.g., with the first face 615-1) and the first face 652-1 of the first PCB card 650 is in contact with the face 622-2 of the second movable mechanism 620-2. Responsive to insertion of the first PCB card 650 into the first socket 660-1, the translation mechanism 628-2 of the second movable mechanism 620-2 can permit the face 622-2 of the second movable mechanism 620-2, when at the position (e.g., the second position) to translate along a plane (e.g., plane 137 as illustrated in FIG. 1), responsive to contact of the face 622-2 of the second movable mechanism 620-2 with a corresponding face (e.g., 652-1) the first PCB card 650 when present. For instance, the first PCB card 650 can be disposed in the first socket 660-1 and subsequently the PCB card retention system 600 can be brought into contact with the first PCB card 650 once disposed in the first socket 660-1, among other possibilities.

Similarly, the second PCB card 651 can include a body having a plurality of faces including a first face 652-5, a second face 652-6, a third face 652-7, and a fourth face 652-8, As illustrated in FIG. 6, the first face 652-5 can be opposite the third face 652-7 and the second face 652-6 can be opposite the fourth face 652-8. The fourth face 652-8 can be disposed in the second socket 660-2 while the third face 652-7 is in contact with the face 622-1 of the first movable mechanism 620-1 and the fixed protrusion 610 (e.g., the face 615-3) is in contact with the first face 652-5 of the second PCB card 651. Responsive to insertion of the second PCB card 651 into the second socket 660-2, the translation mechanism 628-1 of the first movable mechanism 620-1 can permit the face 622-1 of the first movable mechanism 620-1, when at the position (e.g., the first position) to translate along a plane (e.g., plane 137 as illustrated in FIG. 1).

In the foregoing detailed description of the disclosure, reference is made to the accompanying drawings that form a part hereof, and in which is shown by way of illustration how examples of the disclosure can be practiced. These examples are described in sufficient detail to enable those of ordinary skill in the art to practice the examples of this disclosure, and it is to be understood that other examples can be utilized and that process, electrical, and/or structural changes can be made without departing from the scope of the disclosure.

The figures herein follow a numbering convention in which the first digit corresponds to the drawing figure number and the remaining digits identify an element or component in the drawing. Similar elements or components between different figures can be identified by the use of similar digits. For example 102 can reference element "02" in FIG. 1, and a similar element can be referenced as 202 in FIG. 2. Elements shown in the various figures herein can be added, exchanged, and/or eliminated so as to provide a plurality of additional examples of the disclosure. In addition, the proportion and the relative scale of the elements provided in the figures are intended to illustrate the examples of the disclosure and should not be taken in a limiting sense.

What is claimed is:

1. A printed circuit board (PCB) card retention system comprising:
   a bracket;
   a fixed protrusion at a first location on the bracket, wherein the fixed protrusion includes a face to contact a corresponding face of a PCB card, when present; and
   a movable mechanism coupled to the bracket at a second location a distance away from the first location, wherein the movable mechanism includes:
      a face;
      a positioning mechanism to position the face of the movable mechanism at a position of a plurality of positions that are each a different distance away from the face of the fixed protrusion, wherein the positioning mechanism includes an opening to engage a tab of the bracket to maintain the positioning mechanism at the position; and
      a translation mechanism to permit the face of the movable mechanism, when at the position, to translate along a plane extending in a direction orthogonal to the face of the fixed protrusion, responsive to contact of the face of the movable mechanism with the PCB card, when present.

2. The PCB card retention system of claim 1, wherein the face of the fixed protrusion, the face of the movable mechanism, or both, is formed of a resilient material.

3. The PCB card retention system of claim 1, wherein the face of the fixed protrusion further comprises a notch including a planar first face and a planar second face, and wherein the planar first face is orthogonal to the planar second face.

4. The PCB card retention system of claim 1, wherein:
   the positioning mechanism includes a first distal end and a second distal end;
   the translation mechanism includes a first distal end and a second distal end;
   the first distal end of the translation mechanism is movably coupled via a second coupling mechanism to the first distal end of the positioning mechanism; and
   the second distal end of the translation mechanism is movably coupled via a first coupling mechanism to the bracket at the second location.

5. The PCB card retention system of claim 4, wherein the second distal end of the positioning mechanism extends at an angle relative to a body portion of the positioning mechanism to form a handle.

6. The PCB card retention system of claim 5, wherein the body portion of the positioning mechanism includes openings extending through the body portion, and wherein each of the openings are the same shape and size.

7. The PCB card retention system of claim 1, wherein the face of the movable mechanism is arcuate.

8. The PCB card retention system of claim 1, wherein the bracket is formed as an integral portion of a housing of an electronic device.

9. A printed circuit board (PCB) card retention system comprising:
   a bracket;
   a fixed protrusion coupled to the bracket at a first location, the fixed protrusion including:
      a first face to contact a face of a first PCB card, when present; and
      a second face to contact a face of a second PCB card, when present;
   a first movable mechanism coupled to the bracket at a second location, wherein the first movable mechanism includes:
      a face;
      a positioning mechanism to position the face of the first movable mechanism at a plurality of positions that are each a different distance away from the first face of the fixed protrusion; and
      a translation mechanism to permit the face of the first movable mechanism, when at a position of the plurality of positions, to translate with respect to the first face of the fixed protrusion; and
   a second movable mechanism coupled to the bracket at a third location, wherein the second movable mechanism includes:
      a face;
      a positioning mechanism to position the face of the second movable mechanism at a plurality of positions that are each a different distance away from the second face of the fixed protrusion; and
      a translation mechanism to permit the face of the second movable mechanism, when at a position of the plurality of positions, to translate with respect to the second face of the fixed protrusion;
   wherein a distance between the first location and the second location is substantially equal to a distance between the first location and the third location.

10. The PCB card retention system of claim 9, wherein the first face, the second face, the face of the first movable mechanism, and the face of the second movable mechanism are each parallel.

11. The PCB card retention system of claim 9, wherein the first face, the second face, the face of the first movable mechanism, and the face of the second movable mechanism are co-located on a side of the bracket.

12. The PCB card retention system of claim 9, wherein the first location is between the second location and the third location.

13. An electronic device comprising:
   a first socket to receive a first printed circuit board (PCB) card;
   a second socket to receive a second PCB card; and
   a PCB card retention system comprising:
      a bracket;
      a fixed protrusion including:
         a first face to contact a face of the second PCB card; and
         a second face to contact a face of the first PCB card;
      a first movable mechanism including:

a face;

a positioning mechanism to position the face of the first movable mechanism at a position of a plurality of positions that are each a different distance away from the first face of the fixed protrusion; and a translation mechanism to permit the face of the first movable mechanism, when at the position, to translate along a plane extending in a direction orthogonal to the first face of the fixed protrusion, responsive to contact of the face of the first movable mechanism with the second PCB card; and a second movable mechanism including:

a face;

a positioning mechanism to position the face of the second movable mechanism at a position of a plurality of positions that are each a different distance away from the second face of the fixed protrusion, wherein the positioning mechanism of the first movable mechanism is adjustable independently of the positioning mechanism of the second movable mechanism; and a translation mechanism to permit the face of the second movable mechanism, when at the position, to translate along a plane extending in a direction orthogonal to the second face of the fixed protrusion, responsive to contact of the face of the second movable mechanism with the first PCB card.

14. The electronic device of claim 13, further comprising a first PCB card having a first face opposite a third face and a second face opposite a fourth face, wherein the fourth face is disposed in the first PCB socket when the third face is in contact with the fixed protrusion and the first face is in contact with the face of the second movable mechanism.

15. The electronic device of claim 13, further comprising a second PCB card having a first face opposite a third face and a second face opposite a fourth face, wherein the fourth face is disposed in the second PCB socket when the first face is in contact with the fixed protrusion and the third face is in contact with the face of the first movable mechanism.

16. The electronic device of claim 15, wherein the first PCB card, the second PCB card, or both, is a graphics card.

17. The PCB card retention system of claim 13, wherein the fixed protrusion is coupled to the bracket at a first location, the first movable mechanism is coupled to the bracket at a second location, and the second movable mechanism is coupled to the bracket at a third location, wherein a distance between the first location and the second location is equal to a distance between the first location and the third location.

* * * * *